(12) United States Patent
Matsuki et al.

(10) Patent No.: US 9,401,445 B2
(45) Date of Patent: Jul. 26, 2016

(54) ADHESIVE FOR SOLAR BATTERY BACK SHEETS

(71) Applicant: Henkel AG & Co. KGaA, Duesseldorf (DE)

(72) Inventors: Yuichi Matsuki, Osaka (JP); Noriyoshi Kamai, Hyogo (JP); Yasushi Yamada, Osaka (JP)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 14/489,843

(22) Filed: Sep. 18, 2014

(65) Prior Publication Data

US 2015/0005450 A1    Jan. 1, 2015

Related U.S. Application Data

(63) Continuation of application No. PCT/JP2013/058192, filed on Mar. 14, 2013.

(30) Foreign Application Priority Data

Mar. 19, 2012 (JP) .................... 2012-062229

(51) Int. Cl.
| | |
|---|---|
| *H01L 31/048* | (2014.01) |
| *C08G 18/58* | (2006.01) |
| *C08G 18/62* | (2006.01) |
| *C08G 18/66* | (2006.01) |
| *C08G 18/76* | (2006.01) |
| *C08G 18/10* | (2006.01) |

(Continued)

(52) U.S. Cl.
CPC ............ *H01L 31/0481* (2013.01); *C08G 18/10* (2013.01); *C08G 18/3206* (2013.01); *C08G 18/4045* (2013.01); *C08G 18/4211* (2013.01); *C08G 18/4277* (2013.01); *C08G 18/58* (2013.01); *C08G 18/6229* (2013.01); *C08G 18/6283* (2013.01); *C08G 18/6644* (2013.01); *C08G 18/7642* (2013.01);

(Continued)

(58) Field of Classification Search
CPC ............................ C08G 18/4277; C08G 18/10
USPC ............................................ 525/130
See application file for complete search history.

(56) References Cited

U.S. PATENT DOCUMENTS 4,055,534 A * 10/1977 Gerber ............... C08G 18/0852
                                                524/153
4,393,186 A    7/1983 Damico et al.

(Continued)

FOREIGN PATENT DOCUMENTS

| DE | 2109586 A1 | 9/1972 |
| EP | 2315259 A1 | 4/2011 |
| GB | 1338790 A | 11/1973 |
| JP | 2009246360 A | 10/2009 |
| JP | 2011077397 A | 4/2011 |
| WO | 2010005029 A1 | 1/2010 |

OTHER PUBLICATIONS

International Search Report for International Application No. PCT/JP2013/058192 dated Aug. 9, 2013.

*Primary Examiner* — Mike M Dollinger
(74) *Attorney, Agent, or Firm* — James E. Piotrowski (57) ABSTRACT

An adhesive for solar battery back sheets obtainable by mixing (A) a urethane prepolymer having an isocyanate group at the end with (B) a polyol, wherein the urethane prepolymer (A) is obtainable by a reaction of a hydroxyl group-containing compound with an isocyanate compound, and the hydroxyl group-containing compound comprises a polycaprolactone polyol. Also, cured reaction products of the adhesive. Also, a solar battery back sheet and a solar cell module comprising the adhesive.

11 Claims, 1 Drawing Sheet

(51) Int. Cl.
*C08G 18/32* (2006.01)
*C08G 18/40* (2006.01)
*C08G 18/42* (2006.01)
*C09J 175/06* (2006.01)
*H01L 31/049* (2014.01)

(52) U.S. Cl.
CPC .......... *C09J 175/06* (2013.01); *H01L 31/049* (2014.12); *H01L 31/0487* (2013.01); *Y02E 10/50* (2013.01)

(56) References Cited

U.S. PATENT DOCUMENTS

| | | | |
|---|---|---|---|
| 4,842,938 A | 6/1989 | Rizk et al. | |
| 2006/0241228 A1* | 10/2006 | Gertzmann et al. | 524/376 |
| 2009/0292049 A1* | 11/2009 | Tomiyama et al. | 524/323 |
| 2011/0220169 A1 | 9/2011 | Okawara et al. | |
| 2011/0223419 A1* | 9/2011 | Okawara et al. | 428/355 EN |
| 2011/0306724 A1* | 12/2011 | Campbell et al. | 524/591 |

\* cited by examiner

ADHESIVE FOR SOLAR BATTERY BACK SHEETS

CROSS-REFERENCE TO RELATED APPLICATION

This application is a continuation of International Application No. PCT/JP2013/058192, filed Mar. 14, 2013, which claims the benefit of Japanese Patent Application No. 2012-062229 filed on Mar. 19, 2012, the entire contents of each of which is incorporated herein by reference.

TECHNICAL FIELD

The present invention relates to an adhesive for solar battery back sheets. More particularly, the present invention relates to a solar battery back sheet obtainable by using the adhesive, and a solar battery module obtainable by using the solar battery back sheet.

BACKGROUND ART

Practical use of a solar battery as useful energy resources makes progress. The solar battery includes various types, and a silicon based solar battery, an inorganic compound based solar battery, an organic solar battery and the like are known as a typical solar battery.

In these solar batteries, a surface protective sheet is commonly provided on a surface on which sunlight falls, for the purpose of protecting the surface. A back side protective sheet (back sheet) is also provided on a surface opposite to the surface on which sunlight falls, for the purpose of protecting the solar battery cell, and it is required for the back sheet to have various excellent physical properties such as weatherability, water resistance, heat resistance, moisture barrier properties and gas barrier properties so as to suppress long-term performance deterioration of the solar battery to the minimum extent.

In order to obtain a sheet having these various physical properties, various films are used, and examples thereof include metal foils, metal plates and metal deposited films, such as aluminum, copper and steel plates; plastic films such as polypropylene, polyvinyl chloride, polyester, fluorine resin and acrylic resin films; and the like.

In order to further improve performances, a laminate obtainable by laminating these films is also used as the back sheet of the solar battery.

Figure 1:
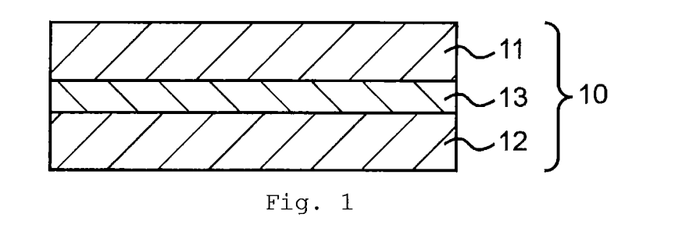
FIG. 1 is a sectional view showing an embodiment of a solar battery back sheet according to the present invention.

An example of the laminate obtained by laminating the films is shown in FIG. 1. A back sheet 10 is a laminate of plural films 11 and 12, and the films 11 and 12 are laminated by interposing an adhesive 13 therebetween.

A lamination method of films is commonly a dry lamination method, and it is required for the adhesive 13 to have sufficient adhesion to the films 11 and 12.

Figure 3:
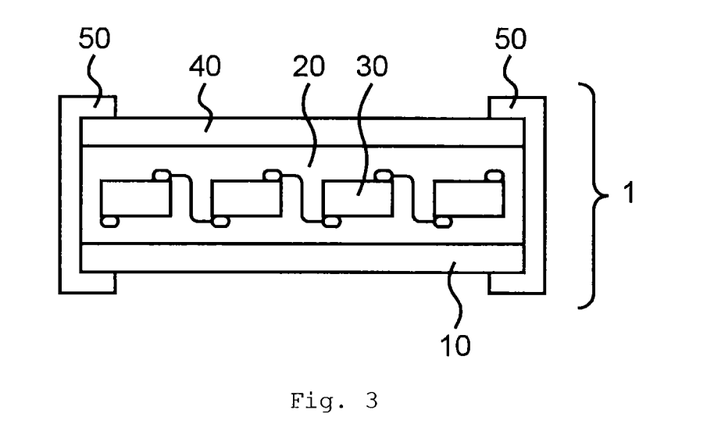
FIG. 3 is a sectional view showing an embodiment of a solar battery module according to the present invention.

The back sheet 10 constitutes a solar battery module 1, together with a sealing material 20, a solar battery cell 30, and a glass plate 40 (see FIG. 3).

Since the solar battery module 1 is exposed outdoors over a long term, sufficient durability against high temperature, high humidity and sunlight is required. Particularly, when the adhesive 13 has low performances, the films 11 and 12 are peeled and thus appearance of the laminated back sheet 10 is impaired. Therefore, it is required that the adhesive for solar battery back sheets 13 does not cause peeling of the film 11 even when the adhesive is exposed over the long term.

A polyurethane is known as an example of an adhesive for solar battery back sheets. Patent Documents 1 to 3 disclose a back sheet of a solar battery produced by using a polyurethane in which a curing agent such as isocyanate is blended with a polyol for the purpose of improving various performances such as weatherability and adhesion.

In Patent Document 1, using an adhesive obtainable by combining an acrylic polymer with an isocyanate curing agent (see Patent Document 1, Tables 1 and 2) as an adhesive for solar battery back sheets, various performances of a solar battery module are improved (see Patent Document 1, Tables 3 and 4).

Patent Documents 2 and 3 disclose polyurethane resins cured by a reaction of a caprolactone based polyol with an isocyanate resin.

Patent Document 2 discloses that the above cured resin is formed on a gas barrier base material as a weatherable coat layer (see Patent Document 2, Claim 1 and [0044] to [0051]). Patent Document 2 ([0103] to [0105]) also discloses that it is possible to apply a polyurethane synthesized from a polyesterpolyol as an adhesive.

Patent Document 3 discloses that a urethane prepolymer obtainable from a caprolactone modified polyesterpolyol and a diisocyanate can be used as a material of a primer layer of a solar battery back sheet (see Patent Document 3, Claim 1 and FIG. 1). Paragraph Number 0057 of the same document discloses use of a polyurethane based adhesive.

In Patent Documents 1 to 3, a polyurethane is used so as to improve weatherability and hydrolysis resistance of a solar battery module. However, it is difficult to say that high requirements of consumers are completely satisfied. Moreover, durability required to the adhesive for solar battery back sheets is getting higher year by year, and thus higher adhesion is required to the adhesive for back sheets. Since the solar battery module is mainly used outdoors, high adhesion at high temperature is required.

Therefore, it is necessary that the adhesive for solar battery back sheets has higher adhesion (particularly, higher adhesion after aging) to a film base material, and also has sufficient adhesion even at high temperature, and has extremely high-level hydrolysis resistance capable of maintaining adhesion even though the adhesive is exposed outdoors over a long time. When the solar battery back sheet is produced by using the adhesives of Patent Documents 1 to 3, a plurality of films composing the back sheet may be peeled each other if outdoor environment is severe.

Patent Document 1: JP 2009-246360 A
Patent Document 2: WO 2010/005029 A1
Patent Document 3: JP 2011-077397 A

SUMMARY OF THE INVENTION

Problems to be Solved by the Invention

The present invention has been made so as to solve such a problem and an object thereof is to provide a urethane adhesive for solar battery back sheets, which has a satisfactory initial adhesion (or adhesive property) to a film after aging in producing a solar battery back sheet, and has high adhesion at high temperature, and also has sufficient hydrolysis resistance over a long time and is excellent in total balance; a solar battery back sheet obtainable by using the adhesive; and a solar battery module obtainable by using the solar battery back sheet.

Means for Solving the Problems

The present inventors have intensively studied and found, surprisingly, that a polyurethane based adhesive obtainable by mixing a urethane prepolymer (A) with a polyol (B) can achieve the above object when a hydroxyl group-containing compound for obtaining the urethane prepolymer (A) contains a specific polyol such as a polycaprolactone polyol, and thus completing the present invention.

That is, the present invention provides, as an aspect, an adhesive for solar battery back sheets obtainable by mixing (A) a urethane prepolymer having an isocyanate group at the end with (B) a polyol, wherein the urethane prepolymer (A) is obtainable by a reaction of a hydroxyl group-containing compound with an isocyanate compound, and the hydroxyl group-containing compound comprises a polycaprolactone polyol.

The present invention provides, as an embodiment, the adhesive for solar battery back sheets, wherein the urethane prepolymer (A) further comprises a trimer of an isocyanate compound.

The urethane prepolymer (A) preferably has an isocyanate index of 2.0 to 4.0.

The present invention provides, as a preferred embodiment, the adhesive for solar battery back sheets, wherein the hydroxyl group-containing compound further comprises trimethylolpropane.

The present invention provides, as a more preferred embodiment, the adhesive for solar battery back sheets, wherein the polyol (B) comprises a polyol having an ester bond.

The polyol having an ester bond preferably comprises a polyesterpolyol.

The present invention provides, as another preferred embodiment, the adhesive for solar battery back sheets, which further comprises an epoxy resin.

The present invention provides, as still another preferred embodiment, the adhesive for solar battery back sheets, wherein the polyol (B) has a glass transition temperature of 10° C. or lower.

The present invention provides, as another aspect, a solar battery back sheet obtainable by using the above adhesive for solar battery back sheets.

The present invention provides, as a preferred aspect, a solar battery module obtainable by using the above solar battery back sheets.

The present invention provides, as a more preferred aspect, a combination of (A) a urethane prepolymer having an isocyanate group at the end with (B) a polyol, for obtaining the above adhesive for solar battery back sheets.

Effects of the Invention

The adhesive for solar battery back sheets according to the present invention is obtainable by mixing (A) a urethane prepolymer having an isocyanate group at the end with (B) a polyol, and the urethane prepolymer (A) is obtainable by a reaction of a hydroxyl group-containing compound with an isocyanate compound, and the hydroxyl group-containing compound comprises a polycaprolactone polyol. Therefore, initial adhesion (or adhesive property) to a film after aging is satisfactory and adhesion at high temperature is high, and also hydrolysis resistance is high, and thus the excellent adhesion can be maintained even after lapse of a long time, and total balance is excellent.

When the urethane prepolymer (A) further comprises a trimer of an isocyanate compound, heat resistance is improved and hydrolysis resistance at high temperature is excellent.

When the urethane prepolymer (A) has an isocyanate index of 2.0 to 4.0, the hydrolysis resistance is further improved and the adhesion is excellent even after lapse of a long time.

The adhesive for solar battery back sheets according to the present invention exhibits excellent hydrolysis resistance at high temperature even after lapse of a long time, and is also excellent in the adhesion after aging when the hydroxyl group-containing compound further comprises trimethylolpropane.

In the adhesive for solar battery back sheets according to the present invention, when the polyol (B) comprises a polyol having an ester bond, the adhesion to a film after aging is more improved.

When the polyol having an ester bond comprises a polyesterpolyol, the adhesion to a film after aging is further improved.

When the adhesive for solar battery back sheets according to the present invention further comprises an epoxy resin, the hydrolysis resistance is more improved, and also the adhesion is excellent even after lapse of a long time.

In the adhesive for solar battery back sheets according to the present invention, when the polyol (B) has a glass transition temperature of 10° C. or lower, the adhesion to a film after aging and the hydrolysis resistance are improved in a well-balanced manner.

Since the solar battery back sheet according to the present invention is obtainable by using the above adhesive for solar battery back sheets, it is possible to prevent peeling of a film from the adhesive under long-term outdoor exposure from an initial stage of lamination.

Since the solar battery module according to the present invention is obtainable by using the above solar battery back sheet, it is less likely to cause poor appearance, and is also excellent in durability.

EMBODIMENTS FOR CARRYING OUT THE INVENTION

The adhesive for solar battery back sheets according to the present invention is obtainable by mixing (A) a urethane prepolymer having an isocyanate group at the end (hereinafter sometimes also referred to as "urethane prepolymer (A)") with (B) a polyol. The urethane prepolymer (A) reacts with the polyol (B) and cures, thereby acting as an adhesive.

The urethane prepolymer (A) is obtainable by a reaction of a hydroxyl group-containing compound with an isocyanate compound, and the hydroxyl group-containing compound comprises a polycaprolactone polyol.

Herein, the hydroxyl group-containing compound can include hydroxyl group-containing compounds usually used in the production of urethane prepolymers, as long as it comprises a polycaprolactone polyol and the objective adhesive of the present invention can be obtained.

Known compounds can be used as the hydroxyl group-containing compound, and may overlap with the polyol (B) in the present invention. Specific examples of the hydroxyl group-containing compound include compounds belonging to the following groups (1) to (7):

(1) polyalcohols such as ethylene glycol, propylene glycol, 1,3-propanediol, 1,4-butanediol, 1,3-butanediol, 1,5-pentanediol, neopentyl glycol, 1,6-hexanediol, 1,4-bis(hydroxymethyl)cyclohexane, bisphenol A, hydrogenated bisphenol A, hydroxypivalyl hydroxypivalate, trimethylolethane, trimethylolpropane, 2,2,4-trimethyl-1,3-pentanediol, glycerin, and hexanetriol;

(2) various polyether glycols such as polyoxyethylene glycol, polyoxypropylene glycol, polyoxyethylene polyoxytetramethylene glycol, polyoxypropylene polyoxytetramethylene glycol, and polyoxyethylene polyoxypropylene polyoxytetramethylene glycol;

(3) modified polyetherpolyols obtainable by a ring-opening polymerization of the above-mentioned various polyalcohols or polyether glycols with various (cyclic) ether bond-containing compounds such as ethylene oxide, propylene oxide, tetrahydrofuran, ethyl glycidyl ether, propyl glycidyl ether, butyl glycidyl ether, phenyl glycidyl ether, and allyl glycidyl ether;

(4) polyesterpolyols obtainable by cocondensation of one or more of the above-mentioned various polyalcohols and polyether glycols with polycarboxylic acids, the polycarboxylic acids being particularly represented by succinic acid, adipic acid, sebacic acid, azelaic acid, phthalic acid, isophthalic acid, terephthalic acid, tetrahydrophthalic acid, hexahydrophthalic acid, maleic acid, fumaric acid, citraconic acid, itaconic acid, glutaconic acid, 1,2,5-hexanetricarboxylic acid, 1,4-cyclohexanedicarboxylic acid, 1,2,4-benzenetricarboxylic acid, 1,2,5-benzenetricarboxylic acid, 1,2,4-cyclohexatricarboxylic acid, and 2,5,7-naphthalenetricarboxylic acid;

(5) lactone based polyesterpolyols obtainable by a polycondensation reaction of one or more of the above-mentioned various polyalcohols and polyether glycols with various lactones such as ε-caprolactone, δ-valerolactone, and 3-methyl-δ-valerolactone, or lactone modified polyesterpolyols obtainable by a polycondensation reaction of the above-mentioned various polyalcohols or polyether glycols with polycarboxylic acids and various lactones;

(6) epoxy modified polyesterpolyols obtainable by using one or more of various epoxy compounds such as bisphenol A type epoxy compounds, hydrogenated bisphenol A type epoxy compounds, glycidyl ether of mono- and/or poly-alcohols, and glycidyl ester of monobasic acid and/or polybasic acids in combination at the time of synthesis of polyesterpolyol; and (7) polyester polyamide polyols, polycarbonate polyols, acrylic polyols, polybutadiene polyols, polypentadiene polyols, castor oils, castor oil derivatives, hydrogenated castor oils, hydrogenated castor oil derivatives, hydroxyl group-containing acrylic based copolymers, hydroxyl group-containing fluorine-containing compounds, or hydroxyl group-containing silicone resins.

It is also possible to use, for example, aliphatic polyalcohols such as a polymer or copolymer obtainable by a ring-opening polymerization of ethylene oxide, propylene oxide, and butylene oxide using, as an initiator, a polyalcohol such as ethylene glycol, diethylene glycol, 1,2-propylene glycol, dipropylene glycol, 1,3-butanediol, 1,4-butanediol, 1,6-hexanediol, neopentyl glycol, trimethylolpropane, glycerin, pentaerythritol, and polytetramethylene ether glycol; polyalcohols having a cyclohexyl group, such as a polymer or copolymer obtainable by a ring-opening polymerization of ethylene oxide, propylene oxide, and butylene oxide using, as an initiator, cyclohexanedimethanol, cyclohexanediol, hydrogenated bisphenol A and a glycol thereof; polyalcohols having an aromatic group, such as a polymer or copolymer obtainable by addition of ethylene oxide, propylene oxide, and butylene oxide using, as an initiator, bisphenol A, hydroquinonebis(2-hydroxyethyl ether), p-xylylene glycol, bis(β-hydroxyethyl) terephthalate, and a glycol thereof; and polyalcohol having various functional groups, for example, glycols having a carboxyl group, such as dimethylolpropionic acid and diphenolic acid, and glycols including a tertiary amine such as N-methyldiethanolamine.

These hydroxyl group-containing compounds can be used alone or in combination thereof.

In the present invention, the hydroxyl group-containing compound comprises a "polycaprolactone polyol". In the present invention, the "polycaprolactone polyol" means a polyol obtainable by a ring-opening polymerization of a caprolactone. For example, it comprises a polycaprolactone polyol obtainable by polycondensation reaction of one or more of the above various polyalcohols and polyether glycols with ε-caprolactone, which belongs to the above group (5), and also comprises a modified polycaprolactone polyol obtainable by polycondensation reaction of one or more of the above various polyalcohols and polyether glycols with polycarboxylic acids and ε-caprolactone.

Since the hydroxyl group-containing compound comprises a polycaprolactone polyol, the adhesive for solar battery back sheets of the present invention is excellent in initial adhesion to a film after aging, hydrolysis resistance (adhesion at high temperature, adhesion after lapse of a long time).

Such polycaprolactone polyol is obtainable according to a known method, more specifically, by a ring-opening polymerization of ε-caprolactone in the presence of a catalyst using the below-mentioned polyalcohol as an initiator.

The polyhydric alcohol which is a polymerization initiator of ε-caprolactone includes, for example, ethylene glycol, diethylene glycol, 1,2-propylene glycol, dipropylene glycol, 1,3-butanediol, 1,4-butanediol, 1,6-hexanediol, neopentyl glycol, trimethylolpropane, glycerin, pentaerythritol, and polytetramethylene ether glycol.

In the present invention, it is preferred that the hydroxyl group-containing compound further comprises trimethylolpropane. When the hydroxyl group-containing compound comprises trimethylolpropane, the adhesive for solar battery back sheets of the present invention exhibits excellent hydrolysis resistance even after lapse of a long time under high temperature, and is also excellent in initial adhesion after aging.

Examples of the isocyanate compound include an aliphatic isocyanate, an alicyclic isocyanate and an aromatic isocyanate, and there is no particular limitation on the isocyanate compound as long as the objective adhesive for solar battery back sheets of the present invention can be obtained.

Herein, the "aliphatic isocyanate" refers to a compound which has a chain-like hydrocarbon chain in which isocyanate groups are directly connected to the hydrocarbon chain, and also has no cyclic hydrocarbon chain. Although the "aliphatic isocyanate" may have an aromatic ring, the aromatic ring is not directly connected to the isocyanate groups.

Herein, the aromatic ring is not included in the cyclic hydrocarbon chain.

The "alicyclic isocyanate" is a compound which has a cyclic hydrocarbon chain and may have a chain-like hydrocarbon chain. The isocyanate group may be either directly connected to the cyclic hydrocarbon chain, or may be directly connected to the chain-like hydrocarbon chain which may be present. Although the "alicyclic isocyanate" may include an aromatic ring, the aromatic ring is not directly connected to the isocyanate groups.

The "aromatic isocyanate" refers to a compound which has an aromatic ring, in which isocyanate groups are directly connected to the aromatic ring. Therefore, a compound, in which isocyanate groups are not directly connected to the aromatic ring, is classified into the aliphatic isocyanate or the alicyclic isocyanate even if it includes the aromatic ring in the molecule.

Therefore, for example, 4,4'-diphenylmethane diisocyanate ($OCN-C_6H_4-CH_2-C_6H_4-NCO$) corresponds to the aromatic isocyanate, since the isocyanate groups are directly connected to the aromatic ring. On the other hand, for example, xylylene diisocyanate ($OCN-CH_2-C_6H_4-CH_2-NCO$) corresponds to the aliphatic isocyanate since the isocyanate groups are not directly connected to the aromatic ring and are connected to methylene groups while xylylene diisocyanate includes the aromatic ring.

The aromatic ring may be fused with two or more benzene rings.

Examples of the aliphatic isocyanate include 1,4-diisocyanatobutane, 1,5-diisocyanatopentane, 1,6-diisocyanatohexane (hereinafter referred to as hexamethylene diisocyanate), 1,6-diisocyanato-2,2,4-trimethylhexane, 2,6-diisocyanatohexanoic acid methyl ester (lysine diisocyanate), and 1,3-bis(isocyanatomethyl)benzene (xylylene diisocyanate).

Examples of the alicyclic isocyanate include 5-isocyanato-1-isocyanatomethyl-1,3,3-trimethylcyclohexane (isophorone diisocyanate), 1,3-bis(isocyanatomethyl)cyclohexane (hydrogenated xylylene diisocyanate), bis(4-isocyanatocyclohexyl)methane (hydrogenated diphenylmethane diisocyanate), and 1,4-diisocyanatocyclohexane.

Examples of the aromatic isocyanate include 4,4'-diphenylmethane diisocyanate, p-phenylene diisocyanate, and m-phenylene diisocyanate.

These isocyanate compounds can be used alone or in combination.

In the present invention, there is no particular limitation on the isocyanate compound as long as the objective urethane adhesive according to the present invention can be obtained. It is preferred to select from the aliphatic and alicyclic isocyanates. Particularly, hexamethylene diisocyanate, isophorone diisocyanate, and xylylene diisocyanate are preferable, and xylylene diisocyanate is particularly preferable.

The isocyanate compound may include a trimer of the above isocyanate compound. The trimer of the isocyanate compound preferably includes at least one selected from a timer of isophorone diisocyanate and a trimer of hexamethylene diisocyanate.

It is preferred that the above urethane prepolymer (A) obtainable by a reaction of a hydroxyl group-containing compound with an isocyanate compound further includes a trimer of the above isocyanate compound. The trimer of the isocyanate compound preferably includes at least one selected from a trimer of isophorone diisocyanate and a trimer of hexamethylene diisocyanate.

In the present invention, the urethane prepolymer (A) preferably has an isocyanate index of 2.0 to 4.0. When the isocyanate index is within the above range, the hydrolysis resistance of the adhesive for solar battery back sheets is more improved, and is also excellent in adhesion even after lapse of a long term.

As used herein, the isocyanate index has a meaning which is usually used in the technical field of polyurethanes, and means an equivalent ratio of an isocyanate group (NCO) contained in an isocyanate compound to a hydroxyl group (OH) of a hydroxyl group-containing compound, (that is, NCO/OH), in producing the urethane prepolymer (A). When (NCO/OH) is more than 1.0, it means that hydroxyl groups are completely consumed in producing the polyurethane prepolymer and thus a NCO group exists at the end of the urethane prepolymer (A).

In the present invention, there is no particular limitation on the polyol (B) as long as it reacts with the urethane prepolymer (A) and the objective adhesive for solar battery back sheets of the present invention can be prepared, and the polyol may overlaps with the previously mentioned hydroxyl group-containing compound.

As a preferred embodiment of the present invention, the polyol (B) preferably includes a polyol having an ester bond, and is more preferably a polyol having an ester bond. There is no particular limitation on the polyol having an ester bond as long as the adhesive for solar battery back sheets of the present invention can be obtained, and the polyol includes common so-called polyesterpolyols and acrylic polyols.

In the present invention, the "polyesterpolyol" refers to a compound which is "main chain type" polyester and has an ester bond and a hydroxyl group in "main chain". This hydroxyl group is usually located at the end of the main chain, and acts as a functional group which reacts with an isocyanate group.

The polyesterpolyol is commonly obtainable by a condensation polymerization reaction of a low-molecular weight polyol with a dicarboxylic acid and an anhydride thereof. That is, it corresponds to the group (4) exemplified for the "hydroxyl group-containing compound" herein. In the present invention, a polyesterpolyol synthesized from isophthalic acid is most preferable.

In the present invention, the "acrylic polyol" refers to a compound obtainable by an addition polymerization reaction of a (meth)acrylate having a hydroxyl group, and has an ester bond in "side chain".

The "acrylic polyol" may be either a homopolymer of the (meth)acrylate having a hydroxyl group, or a copolymer of it with the "other polymerizable monomer". The hydroxyl group of the acrylic polyol reacts with an isocyanate group.

The "(meth)acrylate having a hydroxyl group" includes, for example, 2-hydroxyethyl(meth)acrylate, 2-hydroxypropyl(meth)acrylate, 3-hydroxypropyl(meth)acrylate, glycerin mono(meth)acrylate, and 4-hydroxybutyl acrylate.

The "other polymerizable monomer" refers to a "radical polymerizable monomer having an ethylenic double bond" other than the "(meth)acrylate having a hydroxyl group". Specific examples thereof include (meth)acrylic acid, methyl (meth)acrylate, ethyl(meth)acrylate, butyl(meth)acrylate, cyclohexyl(meth)acrylate, 2-ethylhexyl(meth)acrylate, dicyclopentanyl(meth)acrylate, isobornyl(meth)acrylate, styrene, and vinyltoluene.

As long as the objective adhesive for solar battery back sheets of the present invention can be obtained, the polyol (B) may include a polyol other than a polyol having an ester bond. For example, it may include a polyetherpolyol. The polyetherpolyol includes, for example, polyoxytetramethylene glycol (PTMG), polyoxypropylene glycol (PPG), and polyoxyethylene glycol (PEG).

The polyol (B) in the present invention preferably has a glass transition temperature of 10° C. or lower, particularly preferably 5° C. or lower, and most preferably −30° C. to 5° C. When the glass transition temperature is within the above range, it is possible to improve the initial adhesion to a film after aging, the hydrolysis resistance (the adhesion at high temperature, and the adhesion after lapse of a long time) of the adhesive for solar battery back sheets in a well-balanced manner.

Herein, the "glass transition temperature" refers to a value determined in the following manner. Using a differential scanning calorimeter (SII Nanotechnology DSC6220, manufactured by SII NanoTechnology Inc.), a DSC curve of 5 to 15 mg of a sample was obtained by measuring at a temperature rise rate of 5° C./minute, and then an inflection-point temperature of the obtained DSC curve was regarded as the glass transition temperature.

The adhesive for solar battery back sheets according to the present invention is a urethane adhesive obtainable by mixing (A) a urethane prepolymer with (B) a polyol. A reaction occurs when both the components are only mixed. The mixing method may be a common mixing method.

The adhesive for solar battery back sheets of the present invention may contain an ultraviolet absorber for the purpose of improving long-term weatherability. It is possible to use, as the ultraviolet absorber, a hydroxyphenyltriazine based compound and other commercially available ultraviolet absorbers. The "hydroxyphenyltriazine based compound" is a kind of a triazine derivative in which a hydroxyphenyl derivative is connected to a carbon atom of the triazine derivative, and examples thereof include TINUVIN 400, TINUVIN 405, TINUVIN 479, TINUVIN 477 and TINUVIN 460 (all of which are trade names) which are available from BASF Corporation.

The adhesive for solar battery back sheets may further contain a hindered phenol based compound. The "hindered phenol based compound" is commonly referred to a compound as a hindered phenol based compound, and there is no particular limitation as long as the objective adhesive for solar battery back sheets according to the present invention can be obtained.

Commercially available products can be used as the hindered phenol based compound. The hindered phenol based compound is, for example, commercially available from BASF Corp. Examples thereof include IRGANOX1010, IRGANOX1035, IRGANOX1076, IRGANOX1135, IRGANOX1330 and IRGANOX1520 (all of which are trade names). The hindered phenol based compound is added to the adhesive as an antioxidant and may be used, for example, in combination with a phosphite based antioxidant, a thioether based antioxidant, and an amine based antioxidant.

The adhesive for solar battery back sheets according to the present invention may further contain a hindered amine based compound.

The "hindered amine based compound" is commonly referred to a compound as a hindered amine based compound, and there is no particular limitation as long as the objective adhesive for solar battery back sheets according to the present invention can be obtained.

Commercially available products can be used as the hindered amine based compound. Examples of the hindered amine based compound include TINUVIN 765, TINUVIN 111FDL, TINUVIN 123, TINUVIN 144, TINUVIN 152, TINUVIN 292 and TINUVIN 5100 (all of which are trade names) which are commercially available from BASF Corp. The hindered amine based compound is added to the adhesive as a light stabilizer and may be used, for example, in combination with a benzotriazole based compound, a benzoate based compound, and a benxotriazole compound.

The adhesive for solar battery back sheets according to the present invention may further contain a silane compound.

It is possible to use, as the silane compound, for example, (meth)acryloxyalkyltrialkoxysilanes, (meth)acryloxyalkylalkylalkoxysilanes, vinyltrialkoxysilanes, vinylalkylalkoxysilanes, epoxysilanes, mercaptosilanes, and isocyanuratesilanes. However, the silane compound is not limited only to these silane compounds.

Examples of the "(meth)acryloxyalkyltrialkoxysilanes" include 3-(meth)acryloxypropyltrimethoxysilane, 3-(meth)acryloxypropyltriethoxysilane, and 4-(meth)acryloxyethyltrimethoxysilane.

Examples of the "(meth)acryloxyalkylalkylalkoxysilanes" include 3-(meth)acryloxypropylmethyldimethoxysilane, 3-(meth)acryloxypropylmethyldiethoxysilane, 3-(meth)acryloxypropylethyldiethoxysilane, and 3-(meth)acryloxyethylmethyldimethoxysilane.

Examples of the "vinyltrialkoxysilanes" include vinyltrimethoxysilane, vinyltriethoxysilane, vinyldimethoxyethoxysilane, vinyltri(methoxyethoxy)silane, and vinyltri(ethoxymethoxy)silane.

Examples of the "vinylalkylalkoxysilanes" include vinylmethyldimethoxysilane, vinylethyldi(methoxyethoxy)silane, vinyldimethylmethoxysilane, and vinyldiethyl(methoxyethoxy)silane.

For example, the "epoxysilanes" can be classified into glycidyl based silanes and epoxycyclohexyl based silanes. The "glycidyl based silanes" have a glycidoxy group, and specific examples thereof include 3-glycidoxypropylmethyldiisopropenoxysilane, 3-glycidoxypropyltrimethoxysilane, 3-glycidoxypropyltriethoxysilane, and 3-glycidoxypropyldiethoxysilane.

The "epoxycyclohexyl based silanes" have a 3,4-epoxycyclohexyl group, and specific examples thereof include 2-(3,4-epoxycyclohexyl)ethyltrimethoxysilane, and 2-(3,4-epoxycyclohexyl)ethyltriethoxysilane.

Examples of the "mercaptosilanes" include 3-mercaptopropyltrimethoxysilane and 3-mercaptopropyltriethoxysilane.

Examples of the "isocyanurate silanes" include tris(3-(trimethoxysilyl)propyl)isocyanurate.

The adhesive for solar battery back sheets according to the present invention can further contain other components as long as the objective adhesive for solar battery back sheets can be obtained.

There is no particular limitation on timing of the addition of the "other components" to the adhesive for solar battery back sheets as long as the objective adhesive for solar battery back sheets according to the present invention can be obtained.

Timing of the addition of the other component may be as follows:

(1) when a urethane prepolymer (A) is synthesized, the other component is added together with a hydroxyl group-containing compound and an isocyanate compound;

(2) when a urethane adhesive is synthesized by reacting a urethane prepolymer (A) with a polyol (B), the other component is added together with both components (A) and (B); and (3) after a urethane adhesive is synthesized by reacting a urethane prepolymer (A) with a polyol (B), the other component is added.

Examples of the "other components" include a tackifier resin, a pigment, a plasticizer, a flame retardant, a catalyst, and a wax.

Examples of the "tackifier resin" include a styrene based resin, a terpene based resin, aliphatic petroleum resin, an aromatic petroleum resin, a rosin ester, an acrylic resin, and a polyester resin (excluding polyesterpolyol).

Examples of the "pigment" include titanium oxide and carbon black.

Examples of the "plasticizer" include dioctyl phthalate, dibutyl phthalate, diisononyl adipate, dioctyl adipate, and mineral spirit.

Examples of the "flame retardant" include a halogen based flame retardant, a phosphorous based flame retardant, an antimony based flame retardant, and a metal hydroxide based flame retardant.

Examples of the "catalyst" include metal catalysts such as tin catalysts (trimethyltin laurate, trimethyltin hydroxide, stannous octoate, dibutyltin dilaurate, dibutyltin diacetate, dibutyltin maleate, etc.), lead based catalysts (lead oleate, lead naphthenate, lead octenoate, etc.), and other metal catalysts (naphthenic acid metal salts such as cobalt naphthenate) and amine based catalysts such as triethylenediamine, tetramethylethylenediamine, tetramethylhexylenediamine, diazabicycloalkenes, and dialkylaminoalkylamines.

The "wax" is preferably wax such as a paraffin wax and a microcrystalline wax.

Viscosity of the adhesive for solar battery back sheets is measured by using a rotational viscometer (Model BM, manufactured by TOKIMEC Inc.) When solution viscosity at the solid content of 40% is 4,000 mPas or more, coatability of the adhesive can deteriorate. If a solvent is further added so as to decrease the viscosity, coating is performed at low solid content concentration, and thus productivity of the solar battery back sheet may deteriorate.

The adhesive for solar battery back sheets of the present invention can be produced by mixing the above-mentioned urethane resin and other components which are optionally added. There is no particular limitation on the mixing method as long as the objective adhesive for solar battery back sheets of the present invention can be obtained. There is also no particular limitation on the order of mixing the components. The adhesive for solar battery back sheets according to the present invention can be produced without requiring a special mixing method and a special mixing order. The obtained adhesive for solar battery back sheets has sufficient initial adhesion to a film after aging. Since the adhesive maintains excellent hydrolysis resistance at a high level, it also has improved adhesion at high temperature and improved adhesion after lapse of a long term, and is excellent in total balance.

It is required for an adhesive for producing a solar battery module to have adhesion and hydrolysis resistance in a particularly high level. The adhesive for solar battery back sheets of the present invention has satisfactory adhesion to a film after aging and excellent hydrolysis resistance, and thus the adhesive is suitable as an adhesive for solar battery back sheet.

In the case of producing a solar battery back sheet, the adhesive of the present invention is applied to a film. The application can be performed by various methods such as gravure coating, wire bar coating, air knife coating, die coating, lip coating and comma coating methods. Plural films coated with the urethane adhesive for solar battery back sheets of the present invention are laminated with each other to obtain a solar battery back sheet.

The present invention provides a combination of the above-mentioned urethane prepolymer having an isocyanate group at the end (A) and the above-mentioned polyol (B), for obtaining the adhesive for solar battery back sheets. The adhesive of the present invention is a so-called two component adhesive in which a reaction is initiated by mixing the urethane prepolymer (A) with the polyol (B), and thus curing occurs. Therefore, it is advantageous that the urethane prepolymer (A) and the polyol (B) are always combined in a state of being easily mixed, and also stored. In this case, the "other component" may be either contained in (A) or (B), or may be separately combined as the "other component". As long as the "other component" does not react with (A), the other component is advantageously contained in (A).

Figure 2:
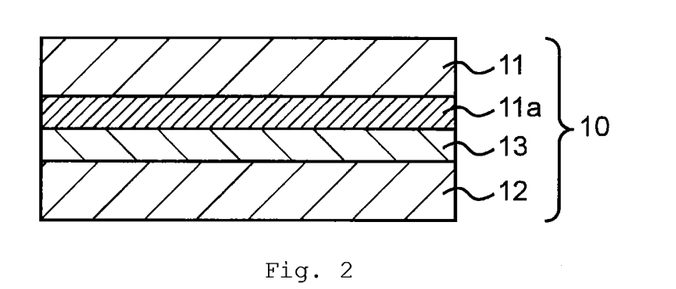
FIG. 2 is a sectional view showing another embodiment of a solar battery back sheet according to the present invention.

Embodiments of the solar battery back sheet of the present invention are shown in FIGS. 1 to 3, but the present invention is not limited to these embodiments.

FIG. 1 is a sectional view of a solar battery back sheet of the present invention. The solar battery back sheet 10 is formed from two films and an adhesive for solar battery back sheet 13 interposed therebetween, and the two films 11 and 12 are laminated each other by the adhesive for solar battery back sheets 13. The films 11 and 12 may be made of either the same or different material. In FIG. 1, the two films 11 and 12 are laminated each other, or three or more films may be laminated one another.

Another embodiment of the solar battery back sheet according to the present invention is shown in FIG. 2. In FIG. 2, a thin film 11a is formed between the film 11 and the adhesive for solar battery back sheet 13. For example, the drawing shows an embodiment in which a metal thin film 11a is formed on the surface of the film 11 when the film 11 is a plastic film. The metal thin film 11a can be formed on the surface of the plastic film 11 by vapor deposition, and the solar battery back sheet of FIG. 2 can be obtained by laminating the metal thin film 11, on which surface the metal thin film 11a is formed, with the film 12 by interposing the adhesive for solar battery back sheet 13 therebetween.

Examples of the metal to be deposited on the plastic film include aluminum, steel, copper and the like. It is possible to impart barrier properties to the plastic film by subjecting the film to vapor deposition. Silicon oxide or aluminum oxide is used as a vapor deposition material. The plastic film 11 as a base material may be either transparent, or white- or black-colored.

A plastic film made of polyvinyl chloride, polyester, a fluorine resin or an acrylic resin is used as the film 12. In order to impart heat resistance, weatherability, rigidity, and insulating properties, a polyethylene terephthalate film or a polybutylene terephthalate film is preferably used. The films 11 and 12 may be either transparent, or may be colored.

The deposited thin film 11a of the film 11 and the film 12 are laminated each other using the adhesive for solar battery back sheets 13 according to the present invention, and the films 11 and 12 are often laminated each other by a dry lamination method. Therefore, it is required for the adhesive for solar battery back sheets 13 to have excellent initial adhesion to a film at the time of lamination and excellent adhesion (or adhesive property) to a film after aging.

FIG. 3 shows a sectional view of an example of a solar battery module of the present invention. In FIG. 3, it is possible to obtain a solar battery module 1 by laying a glass plate 40, a sealing material 20 such as an ethylene-vinyl acetate resin (EVA), plural solar battery cells 30 which are commonly connected each other to generate a desired voltage, and a back sheet 10 one another, and then fixing these members 10, 20, 30 and 40 using a spacer 50.

As mentioned above, since the back sheet 10 is a laminate of the plural films 11 and 12, it is required for the urethane adhesive 13 to cause no peeling of the films 11 and 12 even though the back sheet 10 is exposed outdoors over the long term, and to be excellent in adhesion at high temperature, that is, to have extreme high level hydrolysis resistance.

Main embodiments of the present invention are shown below.

1. An adhesive for solar battery back sheets obtainable by mixing (A) a urethane prepolymer having an isocyanate group at the end with (B) a polyol, wherein the urethane prepolymer (A) is obtainable by a reaction of a hydroxyl group-containing compound with an isocyanate compound, and the hydroxyl group-containing compound comprises a polycaprolactone polyol.

2. The adhesive for solar battery back sheets according to the above 1, wherein the urethane prepolymer (A) further comprises a trimer of an isocyanate compound.

3. The adhesive for solar battery back sheets according to the above 1 or 2, wherein the urethane prepolymer (A) has an isocyanate index of 2.0 to 4.0.

4. The adhesive for solar battery back sheets according to any one of the above 1 to 3, wherein the hydroxyl group-containing compound further comprises trimethylolpropane.

5. The adhesive for solar battery back sheets according to any one of the above 1 to 4, wherein the polyol (B) comprises a polyol having an ester bond.

6. The adhesive for solar battery back sheets according to the above 5, wherein the polyol having an ester bond comprises a polyesterpolyol.

7. The adhesive for solar battery back sheets according to any one of the above 1 to 6, the adhesive further comprises an epoxy resin.

8. The adhesive for solar battery back sheets according to any one of the above 1 to 7, wherein the polyol (B) has a glass transition temperature of 10° C. or lower.

9. A solar battery back sheet obtainable by using the adhesive for solar battery back sheets according to any one of the above 1 to 8.

10. A solar battery module obtainable by using the solar battery back sheets according to the above 9.

11. A combination of (A) a urethane prepolymer having an isocyanate group at the end with (B) a polyol, for obtaining the adhesive for solar battery back sheets according to any one of the above 1 to 8.

EXAMPLES

The present invention will be described below by way of Examples and Comparative Examples, and these Examples are merely for illustrative purposes and are not meant to be limiting on the present invention.

Synthesis of Urethane Prepolymer (A)

Synthetic Example 1

Urethane Prepolymer (A1)

In a four-necked flask equipped with a stirring blade, a thermometer, a nitrogen inlet tube and a reflux condenser, 1.07 parts by weight of polycaprolactone polyol (manufactured by Daicel Corporation), 0.47 part by weight of trimethylolpropane (manufactured by Wako Pure Chemical Industries, Ltd.), and 3.82 parts by weight of ethyl acetate (manufactured by Wako Pure Chemical Industries, Ltd.) were charged so that the concentration of non-volatile components becomes 60% by weight, followed by heating to 60° C. After confirming complete melting of the trimethylolpropane, 4.19 parts by weight of xylylene diisocyanate (XDI) (manufactured by Mitsui Chemicals, Inc.) was added, and the mixture was reacted at about 65° C. for 4 hours. After confirming completion of the reaction, 5.73 parts by weight (9.55 parts by weight of a 60% ethyl acetate solution product) of an isophorone diisocyanate trimer (manufactured by Evonik Industries) was added to obtain a urethane prepolymer (A1) containing 60% by weight of the non-volatile components.

Synthetic Examples 2 to 8

Using components in each amount (part(s) by weight) shown in Table 1 and Table 2, a urethane prepolymer (A2) to a urethane prepolymer (A8) were synthesized. The same synthetic method as that of the urethane prepolymer (A1) was used. Units of Numerals in Table 1 and Table 2 are parts by weight.

TABLE 1

| | Synthetic Examples of urethane prepolymer (A) | | | |
|---|---|---|---|---|
| | (A1) | (A2) | (A3) | (A4) |
| Polycaprolactone polyol 1 | 1.07 | 0.54 | | 2.13 |
| Polycaprolactone polyol 2 | | | 1.92 | |
| Trimethylolpropane | 0.47 | 0.71 | 0.47 | |
| Isocyanate compound | 4.19 | 4.24 | 4.19 | 4.15 |
| Trimer-1 of isocyanate compound | 5.73 | | | 5.69 |
| Trimer-2 of isocyanate compound | | 4.61 | 4.56 | |

TABLE 2

| | Synthetic Examples of urethane prepolymer (A) | | | |
|---|---|---|---|---|
| | (A5) | (A6) | (A'7) | (A'8) |
| Polycaprolactone polyol 1 | 2.33 | 1.75 | | |
| Polycaprolactone polyol 2 | | | | |
| Trimethylolpropane | | | 0.94 | 1.03 |
| Isocyanate compound | 4.55 | 3.40 | 4.20 | 4.61 |
| Trimer-1 of isocyanate compound | | 4.67 | 5.76 | |
| Trimer-2 of isocyanate compound | | | | |

Raw materials in Table 1 and Table 2 are shown below.
Polycaprolactone polyol 1: Polycaprolactone triol (PCL303 (trade name), manufactured by Daicel Corporation)
Polycaprolactone polyol 2: Polycaprolactone triol (PCL305 (trade name), manufactured by Daicel Corporation)
Trimethylolpropane: manufactured by Wako Pure Chemical Industries, Ltd.
Isocyanate compound: Xylylene diisocyanate (XDI) (TAKENATE 500 (trade name), manufactured by Mitsui Chemicals, Inc.)
Isocyanate trimer-1: Isophorone diisocyanate (IPDI) trimer (VESTANAT T1890/100 (trade name), manufactured by Evonik Industries)
Isocyanate trimer-2: Hexamethylene diisocyanate (HDI) trimer (SUMIDULE N3300 (trade name), manufactured by Sumika Bayer Urethane Co., Ltd.)
Synthesis of Adhesive for Solar Battery Back Sheets
The urethane prepolymer (A) was reacted with a polyol (B) to produce an adhesive for solar battery back sheets.
The polyol component (B) is shown in detail below.
Commercially available products were used as the polyesterpolyol.
(B1) Polyesterpolyol synthesized from isophthalic acid (LA2692-21 (trade name), manufactured by Henkel Corporation, glass transition temperature (Tg) 0° C.)
(B2) Polyesterpolyol synthesized from isophthalic acid (UR2790-22 (trade name), manufactured by Henkel Corporation, glass transition temperature (Tg): −29° C.)
(B3) An acrylic polyol was synthesized from a monomer for producing adhesives. The synthetic method is shown below.
Synthesis of Acrylic Polyol (B3)
In a four-necked flask equipped with a stirring blade, a thermometer, and a reflux condenser tube, 150 g of ethyl acetate (manufactured by Wako Pure Chemical Industries, Ltd.) was charged and refluxed at about 80° C. In the flask, 1 g of 2,2-azobisisobutyronitrile was added as a polymerization initiator, and a mixture of monomers in each amount shown in Table 3 was continuously added dropwise over 1 hour and 30 minutes. After heating for additional 2 hours, a solution containing 40.0% by weight of non-volatile components (solid content) of an acrylic polyol was obtained.

The composition of polymerizable monomer components of the acrylic polyol (B3) is show in Table 3.

TABLE 3

| | Parts by weight |
|---|---|
| St | 3 |
| MMA | 22 |
| BA | 56 |
| GMA | 2 |
| AN | 15 |
| HEMA | 2 |
| AIBN | 1 |
| Tg (° C.) | −7 |

Methyl methacrylate (MMA): manufactured by Wako Pure Chemical Industries, Ltd.

Butyl acrylate (BA): manufactured by Wako Pure Chemical Industries, Ltd.

Glycidyl methacrylate (GMA): manufactured by Wako Pure Chemical Industries, Ltd.

Acrylonitrile (AN): manufactured by Wako Pure Chemical Industries, Ltd.

2-Hydroxyethyl methacrylate (HEMA): manufactured by Wako Pure Chemical Industries, Ltd.

Styrene (St): manufactured by Wako Pure Chemical Industries, Ltd.

2,2-Azobisisobutyronitrile (AIBN): manufactured by Otsuka Chemical Co., Ltd.

A glass transition temperature (Tg) of the polyol (B) was determined in the following manner. Using a differential scanning calorimeter (SII Nanotechnology DSC6220, manufactured by SII NanoTechnology Inc.), a DSC curve of 10 mg of a sample was obtained by measuring at a temperature rise rate of 5° C./minute, and then an inflection-point temperature of the obtained DSC curve was regarded as the glass transition temperature.

Example 1

After weighing the urethane prepolymer (A1) containing 11.5 parts by weight of solid content and the polyesterpolyol (B1) containing 88.5 parts by weight of solid content (manufactured by Henkel Corporation) and mixing them, ethyl acetate was added to the mixture to prepare a solution containing 30% by weight of solid content, and then the obtained prepared solution was used as an adhesive for solar battery back sheets.

Production of Film Laminate 1

First, the adhesive for solar battery back sheets of Example 1 was applied to a transparent polyethylene terephthalate (PET) sheet for solar battery back sheets (OE300EW36 (trade name), manufactured by Mitsubishi Polyester Film Corporation) so that the weight of the solid content becomes 10 g/m$^2$, and then dried at 80° C. for 10 minutes.

Then, a surface-treated transparent polyvinylidene fluoride (PVD) film (Kyner Film 302 PGM TR (trade name), manufactured by Arkema Inc.) was laid on the adhesive-coated surface of the PET sheet so that the surface-treated surface is brought into contact with the adhesive-coated surface, and then both films were pressed using a planar press machine (ASF-5 (trade name), manufactured by SHINTO Metal Industries Corporation) under a pressing pressure (or closing pressure) of 1.0 MPa at 50° C. for 30 minutes. While pressing, both the films were aged at 50° C. for a week to obtain a film laminate 1.

Evaluation

Using the adhesives for solar battery back sheets of Examples and Comparative Examples, film laminates were produced and evaluation tests were carried out. The same production method as that of the film laminate 1 was used as a production method of each of the film laminates. The evaluation tests are shown in detail below.

1. Evaluation of Adhesion of Film after Aging

Peel Strength Test

The film laminate was cut out into pieces of 15 mm in width, and a 180° peel test was carried out under a room temperature environment at a tensile test speed of 100 mm/minute using a tensile strength testing machine (TENSILON®-250 (trade name), manufactured by ORIENTEC Co., Ltd.). The evaluation criteria are as shown below.
A: Peel strength is 9 N/15 mm or more.
B: Peel strength is 7 N/15 mm or more and less than 9 N/15 mm
D: Peel strength is less than 7 N/15 mm.

2. Evaluation of Hydrolysis Resistance 2-1 Hydrolysis Resistance at High Temperature Peel Strength Test Evaluation was carried out by an accelerated evaluation method using pressurized steam. The film laminate 1 was cut out into pieces of 15 mm in width, exposed under a pressurized environment at 121° C. under 0.1 MPa for 25 hours using a high pressure cooker (Autoclave SP300 (trade name), manufactured by Yamato Scientific Co., Ltd.), taken out, and then aged for a day under a room temperature environment. Thereafter, the test was carried out in the same manner as the measurement of the peel strength of the aged film. The evaluation criteria are as follows.
A: Peel strength is 9 N/15 mm or more.
B: Peel strength is 7 N/15 mm or more and less than 9 N/15 mm.
D: Peel strength is less than 7 N/15 mm.

2-2 Hydrolysis Resistance Test after Long Time

Evaluation of Peeling

The film laminate 1 was cut out into pieces of 50 mm square and disposed on an aluminum sheet so that the polyvinylidene fluoride side faces upward, followed by sealing of four sides using an aluminum tape. The sealed sample was exposed under a pressurized environment at 121° C. under 0.1 MPa for 100 hours using the high pressure cooker and taken out, and then peeling was evaluated immediately after taking out. The evaluation criteria are as follows.
A: A film cannot be peeled because of strong adhesion force.
B: A film is fractured upon peeling since a strong force is required for peeling.

C: A film is not fractured upon peeling although a force is required for peeling.

D: A film can be easily peeled.

Examples 2 to 6 and Comparative Examples 1 to 3

According to compositions shown in Tables 4 to 6, adhesives for solar battery back sheets were produced. The same production method as that of Example 1 was used in the production of the adhesives for solar battery back sheets. Film laminates were also produced by the same method as that of Example 1.

TABLE 4

| | | Example 1 | Example 2 | Example 3 |
|---|---|---|---|---|
| (A) | (A1) | 11.5 | | |
| | (A2) | | 10.1 | |
| | (A3) | | | 11.1 |
| | (A4) | | | |
| | (A5) | | | |
| | (A6) | | | |
| | (A'7) | | | |
| | (A'8) | | | |
| Isocyanate index | | 3.3 | 3.3 | 3.3 |
| (B) | (B1) | 88.5 | 89.9 | 88.9 |
| | (B2) | | | |
| | (B3) | | | |
| Polyol Tg (° C.) | | 0 | 0 | 0 |
| Epoxy resin | | None | None | 29.6 |
| Adhesion to film after aging (N/15 mm) | | 10.1 A | 10.9 A | 12.1 A |
| Hydrolysis resistance at high temperature Peel strength (N/15 mm) | | 8.7 B | 7.3 B | 9.7 A |
| Hydrolysis resistance after lapse of long period Evaluation of peeling | | A | B | A |

TABLE 5

| | | Example 4 | Example 5 | Example 6 |
|---|---|---|---|---|
| (A) | (A1) | | | |
| | (A2) | | | |
| | (A3) | | | |
| | (A4) | 12.0 | | |
| | (A5) | | 6.9 | |
| | (A6) | | | 9.8 |
| | (A'7) | | | |
| | (A'8) | | | |
| Isocyanate index | | 2.4 | 2.1 | 3.3 |
| (B) | (B1) | 88.0 | | |
| | (B2) | | | 90.2 |
| | (B3) | | 93.1 | |
| Polyol Tg (° C.) | | 0 | -7 | -29 |
| Epoxy resin | | None | None | 30.1 |
| Adhesion to Film after aging (N/15 mm) | | 11.6 A | 9.7 A | 14.7 A |
| Hydrolysis resistance at high temperature Peel strength (N/15 mm) | | 8.5 B | 12.5 A | 11.4 A |
| Hydrolysis resistance after lapse of long period Evaluation of peeling | | A | C | B |

TABLE 6

| | | Comparative Example 1 | Comparative Example 2 | Comparative Example 3 |
|---|---|---|---|---|
| (A) | (A1) | | | |
| | (A2) | | | |
| | (A3) | | | |
| | (A4) | | | |
| | (A5) | | | |
| | (A6) | | | |
| | (A'7) | 10.9 | | |
| | (A'8) | | | 5.6 |
| Isocyanate index | | 3.3 | — | 2.1 |
| Trimer-2 of isocyanate compound | | | 9.3 | |
| (B) | (B1) | 89.1 | 90.7 | |
| | (B2) | | | |
| | (B3) | | | 94.4 |
| Polyol Tg (° C.) | | 0 | 0 | -7 |
| Epoxy resin | | None | None | None |
| Adhesion to film after aging (N/15 mm) | | 8.3 B | 7.1 B | 9.7 A |
| Hydrolysis resistance at high temperature Peel strength (N/15 mm) | | 6.7 D | 6.4 D | 4.6 D |
| Hydrolysis resistance after lapse of long period Evaluation of peeling | | D | D | D |

The following was used as the epoxy resin in Table 4 and Table 5.

Epoxy resin: manufactured by Mitsubishi Chemical Corporation jER828 (trade name)

As shown in Tables 4 to 5, the adhesives for solar battery back sheets of Examples are excellent in initial adhesion to a film after aging and exhibit high adhesion at high temperature, and also have very high-level hydrolysis resistance since the urethane prepolymer (A1) to the urethane prepolymer (A6) are obtainable by a reaction of a hydroxyl group-containing compound containing a polycaprolactone polyol with an isocyanate compound.

In contrast, the adhesives for solar battery back sheets of Comparative Examples are drastically inferior in hydrolysis resistance since the urethane prepolymer (A'7) to the urethane prepolymer (A'8) are obtained by a reaction of a hydroxyl group-containing compound containing no polycaprolactone polyol with an isocyanate compound, as shown in Table 6. With respect to adhesion to a film after aging, the adhesives for solar battery back sheets of Comparative Examples do not have excellent performances as compared with the adhesives for solar battery back sheets of Examples.

These results demonstrated that a urethane adhesive suited for solar battery back sheets can be obtained when the hydroxyl group-containing compound as a raw material of the urethane prepolymer (A) contains a polycaprolactone polyol. Furthermore, when a polyol (B) contains a polyesterpolyol or an epoxy resin is post-added to the obtained urethane adhesive, the urethane adhesive is more suited as an adhesive for solar battery back sheets.

INDUSTRIAL APPLICABILITY

The present invention provides an adhesive for solar battery back sheets. The adhesive for solar battery back sheets according to the present invention is excellent in productivity and has high adhesion to a back sheet film and long-term durability, and also can be suitably used in a solar battery back sheet and a solar battery module.

DESCRIPTION OF REFERENCE NUMERALS

1: Solar battery module, 10: Back sheet, 11: Film
11a: Deposited thin film, 12: Film, 13: Adhesive layer
20: Sealing material (EVA), 30: Solar battery cell
40: Glass plate, 50: Spacer

What is claimed is:

1. A two component adhesive for solar battery back sheets comprising (A) a urethane prepolymer having an isocyanate group at the end, wherein the urethane prepolymer (A) is a reaction product of a hydroxyl group-containing compound comprising a polycaprolactone polyol with an isocyanate compound, and (B) a polyol having a glass transition temperature of −30° C. to 10° C.

2. The adhesive for solar battery back sheets according to claim 1, wherein the urethane prepolymer (A) further comprises a trimer of an isocyanate compound.

3. The adhesive for solar battery back sheets according to claim 1, wherein the urethane prepolymer (A) has an isocyanate index of 2.0 to 4.0.

4. The adhesive for solar battery back sheets according to claim 1, wherein the hydroxyl group-containing compound further comprises trimethylolpropane.

5. The adhesive for solar battery back sheets according to claim 1, the adhesive further comprises an epoxy resin.

6. The adhesive for solar battery back sheets according to claim 1, wherein the polyol (B) has a glass transition temperature of −30° C. to 5° C.

7. A solar battery back sheet comprising the adhesive for solar battery back sheets according to claim 1.

8. A solar battery module comprising the solar battery back sheets according to claim 7.

9. A solar battery back sheet comprising cured reaction products of the adhesive of claim 1.

10. Cured reaction products of the adhesive of claim 1.

11. A two component adhesive for solar battery back sheets comprising (A) a urethane prepolymer having an isocyanate group at the end, wherein the urethane prepolymer (A) is a reaction product of a hydroxyl group-containing compound comprising a polycaprolactone polyol with an isocyanate compound, and (B) a polyol chosen from the group consisting of a polyesterpolyol or a polyacrylic polyol, the polyol (B) having a glass transition temperature of −30° C. to 10° C. wherein a curing reaction is initiated by mixing the urethane prepolymer (A) with the polyol (B).

* * * * *